United States Patent
Chiba et al.

(10) Patent No.: US 6,714,090 B2
(45) Date of Patent: Mar. 30, 2004

(54) VOLTAGE CONTROLLED OSCILLATOR WITH ENHANCED SENSITIVITY OF CHANGE OF OSCILLATION FREQUENCY

(75) Inventors: Yutaka Chiba, Fukushima-ken (JP); Hiroki Noumi, Miyagi-ken (JP); Yasuhiro Ikarashi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/244,932

(22) Filed: Sep. 16, 2002

(65) Prior Publication Data
US 2003/0052741 A1 Mar. 20, 2003

(30) Foreign Application Priority Data
Sep. 18, 2001 (JP) ........................................ 2001-283024
Sep. 19, 2001 (JP) ........................................ 2001-284779

(51) Int. Cl.[7] ................................................ H03B 5/18
(52) U.S. Cl. .................. 331/117 D; 331/96; 331/177 V; 331/179
(58) Field of Search ............................ 331/96, 107 DP, 331/107 SL, 117 R, 117 FE, 117 D, 177 R, 177 V, 179

(56) References Cited
U.S. PATENT DOCUMENTS
6,501,338 B2 * 12/2002 Nakano et al. ............... 331/48

FOREIGN PATENT DOCUMENTS
JP          HEI 10-056306          2/1998

* cited by examiner

Primary Examiner—David Mis
(74) Attorney, Agent, or Firm—Brinks Hofer Gilson & Lione

(57) ABSTRACT

A voltage controlled oscillator comprises an oscillation transistor, a varactor diode, a resonance circuit which is coupled to the oscillation transistor, and a switching diode which changes over a resonance frequency of the resonance circuit, wherein the resonance circuit includes a first strip conductor which is served for grounding a cathode of the varactor diode in terms of direct current and a second strip conductor which is served for coupling a cathode of the varactor diode with the oscillation transistor, the switching diode is connected to the first strip conductor in parallel in terms of high frequency and has a cathode thereof grounded, and a control voltage which is served for changing a capacitive value of the varactor diode is applied to a connection point between the cathode of the varactor diode and the second strip conductor through a choke inductor.

4 Claims, 3 Drawing Sheets

VOLTAGE CONTROLLED OSCILLATOR WITH ENHANCED SENSITIVITY OF CHANGE OF OSCILLATION FREQUENCY

BACKGROUND OF THE INVENTION

1. Field of the Invention

The present invention relates to a voltage controlled oscillator.

2. Description of the Related Art

A constitution of a conventional voltage controlled oscillator is shown in FIG. 5. A given bias voltage is applied to an oscillation transistor 31 by a series circuit not shown in the drawing. A resonance circuit 32 is constituted of a series circuit of a varactor diode 33 and a strip conductor 34. The strip conductor 34 is formed of two small strip conductors 34a, 34b which are connected in series. The varactor diode 33 has an anode thereof grounded through the strip conductor 34 and a cathode thereof is coupled to a base of the oscillation transistor 31 through a Clapp capacitor 35.

To a connection point between the small strip conductors 34a, 34b, an anode of a switching diode 36 is connected through a DC cut capacitor 37. A cathode of the switching diode 36 is grounded. Then, a cathode of the varactor diode 33 is connected to a control voltage terminal 39 through a choke inductor 38. To the control voltage terminal 39, a control voltage served for changing a capacitive value of the varactor diode 33 is applied. The anode of the switching diode 36 is connected to a band changeover terminal 41 through a resistance 40. A voltage is applied to the band changeover terminal 41 at the time of turning on the switching diode 36.

In such a constitution, when the switching diode 36 is turned on, both ends of the small strip conductor 34b are short-circuited by the switching diode 36 so that an oscillation frequency assumes a high band. On the other hand, when the switching diode 36 is turned off, the oscillation frequency assumes a low band. In both bands, the oscillation frequency can be changed in response to the control voltage.

In the above-mentioned prior art, although the oscillation is generated in a frequency range where a resonance circuit is inductive, the choke inductor is connected to the resonance circuit in parallel and hence, there has been a drawback that a change rate of an equivalent inductance value of the resonance circuit with respect to the change of capacity of the varactor diode is small and, particularly, sensitivity of change of the oscillation frequency in a low frequency band when the switching diode is turned off is lowered. FIG. 6 is a graph which shows a changing state of the oscillation frequency with respect to the control voltage applied to the varactor diode when the switching diode is turned off. From the graph, it is understood that the sensitivity is particularly low in a region where the control voltage is equal to or below 2.5 volts.

Further, in the above-mentioned conventional example, the switching diode has a capacitive component in an OFF state and, at the same time, a minute resistance component derived from a terminal is connected to the capacitive component in series. Eventually, this series circuit is connected to one small strip conductor in parallel. Due to such a constitution, and particularly due to the resistance component, a Q value of one strip conductor is lowered thus giving rise to a problem that C/N of oscillation signals is deteriorated.

Accordingly, it is an object of the present invention to provide a voltage controlled oscillator which can enhance the sensitivity of change of an oscillation frequency with respect to a control voltage applied to a varactor diode.

It is another object of the present invention to provide a voltage controlled oscillator which can prevent the deterioration of C/N of oscillation signals which may be caused by a minute resistance component of a switching diode.

SUMMARY OF THE INVENTION

To overcome the above-mentioned drawbacks of the prior art, according to the present invention, there is provided a voltage controlled oscillator which includes an oscillation transistor, a varactor diode, a resonance circuit which is coupled to the oscillation transistor, and a switching diode which changes over a resonance frequency of the resonance circuit, wherein the resonance circuit includes a first strip conductor which is served for grounding a cathode of the varactor diode in terms of direct current and a second strip conductor which is served for coupling a cathode of the varactor diode with the oscillation transistor, the switching diode is connected to the first strip conductor in parallel in terms of high frequency and has a cathode thereof grounded, and a control voltage which is served for changing a capacitive value of the varactor diode is applied to a connection point between the cathode of the varactor diode and the second strip conductor through a choke inductor.

Further, according to the present invention, there is provided a voltage controlled oscillator which includes a resonance circuit which is coupled to an oscillation transistor and is constituted of a series circuit of a varactor diode and a strip conductor, and a switching diode which is connected to one lengthwise portion of the strip conductor in parallel in terms of high frequency and changes over an oscillation frequency band in response to an ON state or an OFF state thereof, wherein an inductance element is connected to the switching diode in parallel in terms of high frequency, and an oscillation frequency when the switching diode is in the OFF state is substantially subjected to parallel resonance due to equivalent capacitive values of the inductance element and the switching diode in the OFF state.

Further, one end of the strip conductor and the cathode of the switching diode are grounded.

Still further, the strip conductor is divided into two small strip conductors, wherein one small strip conductor is connected between the varactor diode and the oscillation transistor, the other small strip conductor is connected between the varactor diode and a ground, and the switching diode is connected to the other small strip conductor in parallel.

DESCRIPTION OF PREFERRED EMBODIMENT

A preferred embodiment of the present invention is explained hereinafter in conjunction with attached drawings.

Figure 1:
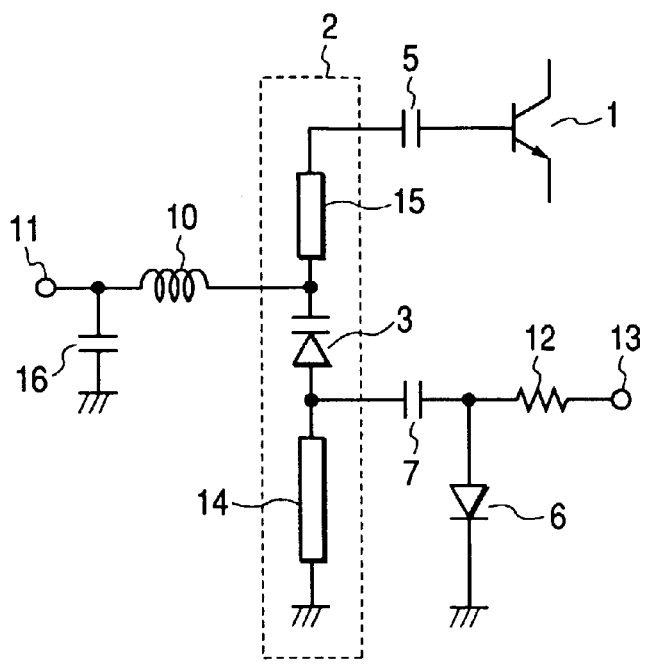
FIG. 1 is a circuit diagram showing the first constitution of a voltage controlled oscillator of the present invention.

FIG. 1 shows the first constitution of a voltage controlled oscillator of the present invention. A given bias voltage is applied to an oscillation transistor 1 by a series circuit not shown in the drawing. A resonance circuit 2 is constituted of a series circuit of a varactor diode 3 and two strip conductors 14, 15. The varactor diode 3 has an anode thereof grounded through the first strip conductor 14 and a cathode thereof is connected to a Clapp capacitor 5 through the second strip conductor 15 and coupled to a base of the oscillation transistor 1 through the Clapp capacitor 5.

To a connection point between the first strip conductor 4 and the varactor diode 3, an anode of a switching diode 6 is connected through a DC cut capacitor 7. A cathode of the switching diode 6 is grounded. Further, a band changeover terminal 13 is connected to the switching diode 6 through a resistance 12. A voltage is applied to the band changeover terminal 13 at the time of turning on the switching diode 6.

A cathode of the varactor diode 3 is connected to a control voltage terminal 11 through a choke inductor 10. A control voltage served for changing a capacitive value of the varactor diode 3 is applied to the control voltage terminal 11. The control voltage terminal 11 is grounded in terms of high frequency through a grounding capacitor 16.

Due to such a constitution, when the switching diode 6 is turned on, both ends of the first strip conductor 14 are short-circuited by the switching diode 6 and the oscillation frequency assumes a high frequency band. On the other hand, when the switching diode 6 is turned off, the oscillation frequency assumes the low band. The oscillation frequency can be changed in response to the control voltage in both bands.

Figure 2:
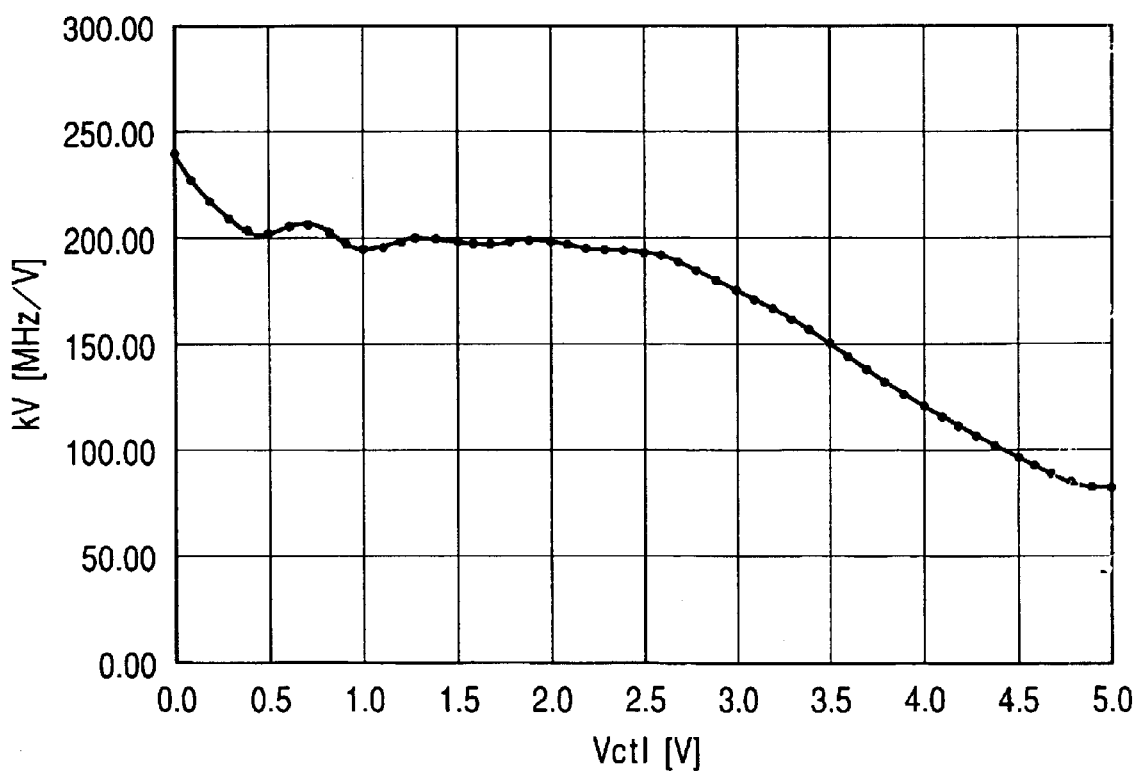
FIG. 2 is a graph showing the sensitivity of oscillation frequency in the first constitution of the voltage controlled oscillator of the present invention.

Here, although the oscillation is performed in the frequency range where the resonance circuit 2 is inductive, the choke inductor 10 is connected in parallel to a series circuit of the varactor diode 3 and the first strip conductor 14 which form portions of the resonance circuit 2. The equivalent inductance of this series circuit is smaller than the equivalent inductance of the whole resonance circuit 2. Accordingly, the change rate of the inductance including the choke inductor 10 connected in parallel to the series circuit with respect to the change of capacity of the varactor diode 3 is increased. Accordingly, the sensitivity of change of oscillation frequency with respect to the change of the varactor diode 3 is increased as shown in FIG. 2.

Figure 3:
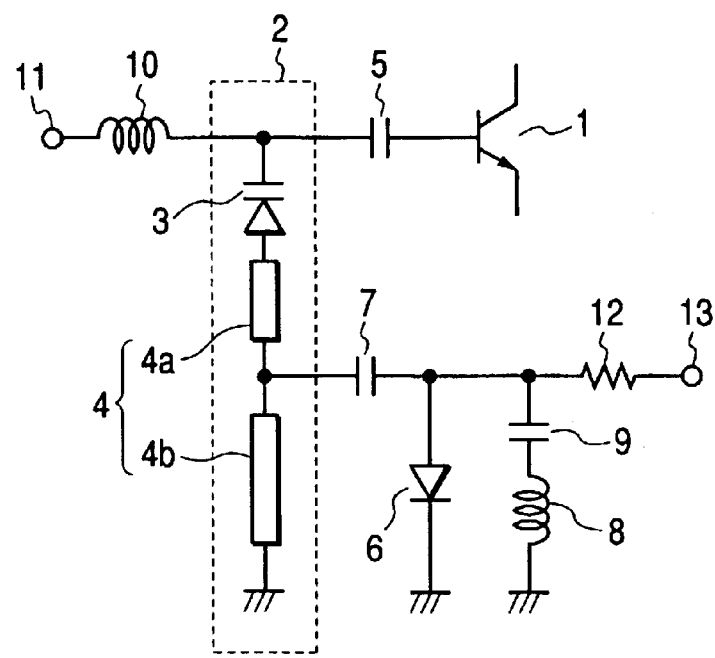
FIG. 3 is a circuit diagram showing the second constitution of a voltage controlled oscillator of the present invention.

FIG. 3 shows the second constitution of the voltage controlled oscillator of the present invention. A given bias voltage is applied to an oscillation transistor 1 by a DC circuit not shown in the drawing. The resonance circuit 2 is constituted of a series circuit of the varactor diode 3 and the strip conductor 4. The strip conductor 4 is constituted of two small strip conductors 4a, 4b which are connected in series. The varactor diode 3 has an anode thereof grounded through the strip conductor 4 and a cathode thereof is coupled to a base of the oscillation transistor 1 through the Clapp capacitor 5.

An anode of the switching diode 6 is connected to a connection point between the small strip conductors 4a, 4b through the DC cut capacitor 7. A cathode of the switching diode 6 is grounded. Further, an inductance element 8 is connected to the switching diode 6 in parallel through a DC cut capacitor 9.

Although the inductance element 8 performs the parallel resonance with the equivalent capacitive value when the switching diode 6 is in an OFF state, the resonance frequency is set to a value substantially equal to the oscillation frequency when the switching diode 6 is in the OFF state.

A cathode of the varactor diode 3 is connected to the control voltage terminal 11 through the choke inductor 10. A control voltage served for changing a capacitive value of the varactor diode 3 is applied to the control voltage terminal 11. The anode of the switching diode 6 is connected to the band changeover terminal 13 through the resistance 12. A voltage is applied to the band changeover terminal 13 at the time of turning on the switching diode 6.

Due to such a constitution, when the switching diode 6 is turned on, both ends of the small strip conductor 4b are short-circuited by the switching diode 6 and the oscillation frequency assumes a high frequency band. On the other hand, when the switching diode 6 is turned off, the oscillation frequency assumes the low band. The oscillation frequency can be changed in response to the control voltage in both bands.

Then, the capacitive value of the switching diode 6 and the inductance element 8 are subjected to the parallel resonance in the band where the oscillation frequency is low and hence, lowering of the Q value of the resonance circuit 2 which is caused by a minute resistance component of the switching diode 6 can be reduced and the deterioration of C/N of oscillation signals can be prevented.

Figure 4:
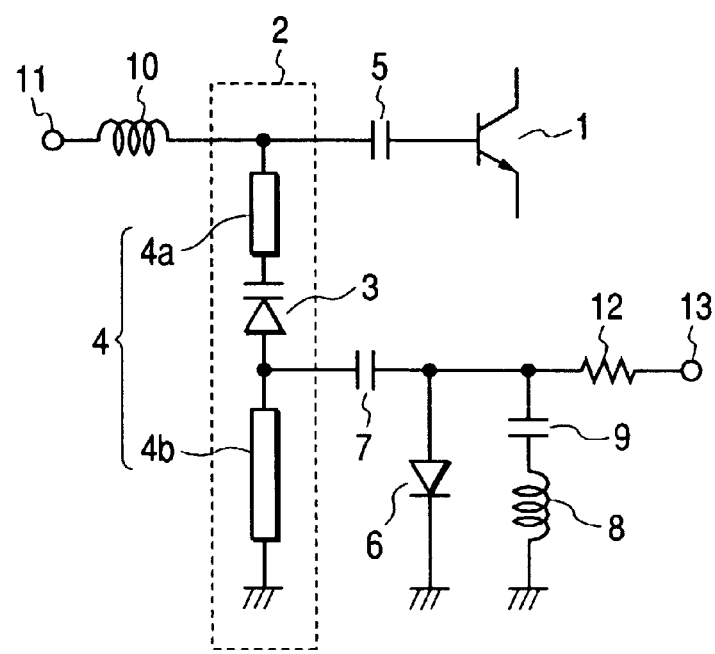
FIG. 4 is a circuit diagram showing the third constitution of a voltage controlled oscillator of the present invention.
Figure 5:
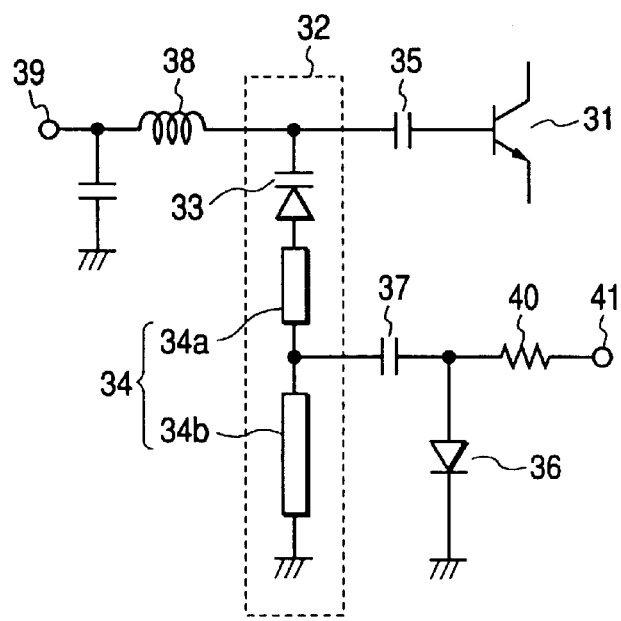
FIG. 5 is a circuit diagram showing the constitution of a conventional voltage controlled oscillator.
Figure 6:
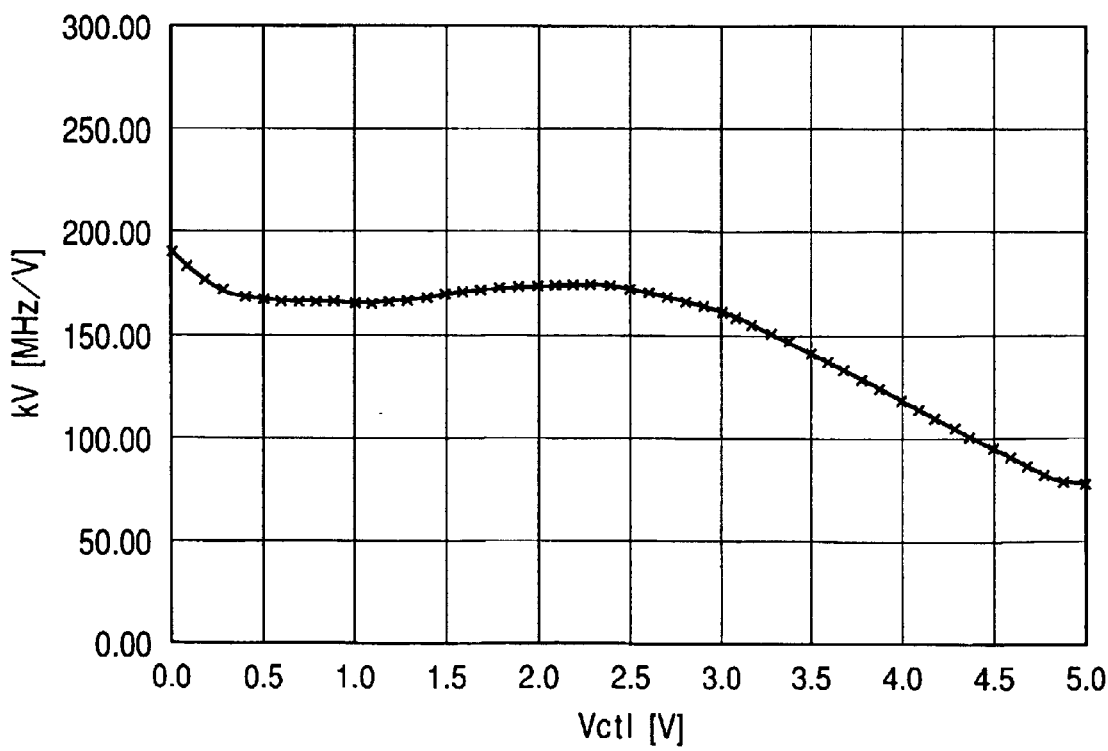
FIG. 6 is a graph showing the sensitivity of oscillation frequency in the conventional voltage controlled oscillator.

FIG. 4 shows the third constitution of the voltage controlled oscillator of the present invention. Although, small strip conductors 4a, 4b in a divided form are arranged at both sides of a varactor diode 3, the manner of operation is similar to that of the second constitution shown in FIG. 3.

As has been described heretofore, according to the present invention, the resonance circuit is constituted of the first strip conductor which is served for grounding the cathode of the varactor diode in terms of direct current and the second strip conductor which is served for coupling the cathode of the varactor diode with the oscillation transistor, the switching diode is connected to the first strip conductor in parallel in terms of high frequency and has the cathode thereof grounded, and the control voltage served for changing the capacitive value of the varactor diode is applied to the connection point between the cathode of the varactor diode and the second strip conductor through the choke inductor. Accordingly, the sensitivity of oscillation frequency with respect to the capacitive change of the varactor diode, that is, with respect to the control voltage applied to the varactor diode is enhanced.

Further, according to the present invention, the voltage controlled oscillator includes the resonance circuit which is coupled to the oscillation transistor and is constituted of the series circuit of the varactor diode and the strip conductor, and the switching diode which is connected to one lengthwise portion of the strip conductor in parallel in terms of high frequency and changes over the oscillation frequency band in response to the ON state or the OFF state thereof, wherein the inductance element is connected to the switching diode in parallel in terms of high frequency, and an oscillation frequency when the switching diode is in the OFF state is substantially subjected to parallel resonance due to equivalent capacitive values of the inductance element and the switching diode in the OFF state. Accordingly, the deterioration of C/N of the oscillation signals which is caused by the minute resistance component of the switching diode can be prevented.

Further, since the one end of the strip conductor and the cathode of the switching diode are grounded, the ON/OFF operation of the switching diode can be simply changed over by applying the changeover voltage to the anode.

Still further, the strip conductor is divided into two small strip conductors, wherein one small strip conductor is connected between the varactor diode and the oscillation transistor and the other small strip conductor is connected between the varactor diode and the ground, and the switching diode is connected to the other small strip conductor in parallel. Accordingly, the control voltage is applied to the cathode of the varactor diode through one small strip conductor and hence, the deterioration of C/N caused by noise components contained in the control voltage can be prevented.

What is claimed is:

1. A voltage controlled oscillator comprising an oscillation transistor, a varactor diode, a resonance circuit which is coupled to the oscillation transistor, and a switching diode which changes over a resonance frequency of the resonance circuit, wherein the resonance circuit includes a first strip conductor and a second strip conductor, a cathode of the varactor diode connected to ground through the first strip conductor at direct current and coupled with the oscillation transistor through the second strip conductor, wherein the switching diode is connected to the first strip conductor in parallel at high frequency and has a cathode thereof grounded, and wherein a control voltage terminal to which a control voltage is supplied and changes a capacitive value of the varactor diode is connected to a connection point between the cathode of the varactor diode and the second strip conductor through a choke inductor.

2. A voltage controlled oscillator comprising a resonance circuit which is coupled to an oscillation transistor and contains a series circuit of a varactor diode and a strip conductor, and a switching diode which is connected to one lengthwise portion of the strip conductor in parallel at high frequency and changes over an oscillation frequency band in response to an ON state or an OFF state thereof, wherein an inductance element is connected to the switching diode in parallel at high frequency, and wherein an oscillation frequency when the switching diode is in the OFF state is substantially subjected to parallel resonance due to equivalent capacitive values of the inductance element and the switching diode in the OFF state.

3. A voltage controlled oscillator according to claim 2, wherein one end of the strip conductor and a cathode of the switching diode are grounded.

4. A voltage controlled oscillator according to claim 2, wherein the strip conductor is divided into two small strip conductors, wherein one small strip conductor is connected between the varactor diode and the oscillation transistor, wherein the other small strip conductor is connected between the varactor diode and ground, and wherein the switching diode is connected to the other small strip conductor in parallel.

* * * * *